United States Patent [19]

Kuwahara

[11] Patent Number: 5,136,254

[45] Date of Patent: Aug. 4, 1992

[54] FM DEMODULATOR CIRCUIT WHOSE DEMODULATION OUTPUT IS DECREASED IN DISTORTION

[75] Inventor: Hisao Kuwahara, Kamakura, Japan

[73] Assignee: Kabushiki Kaisha Toshiba, Kawasaki, Japan

[21] Appl. No.: 727,459

[22] Filed: Jul. 9, 1991

[30] Foreign Application Priority Data

Jul. 10, 1990 [JP] Japan ................................. 2-180534

[51] Int. Cl.[5] .............................................. H03D 3/00
[52] U.S. Cl. .................................... 329/318; 329/337
[58] Field of Search ............... 329/315, 318, 327, 336, 329/337

[56] References Cited

U.S. PATENT DOCUMENTS 4,054,840 10/1977 Sato ..................................... 329/327

FOREIGN PATENT DOCUMENTS 0074710 4/1984 Japan .................................. 329/337

Primary Examiner—Robert J. Pascal
Attorney, Agent, or Firm—Finnegan, Henderson, Farabow, Garrett and Dunner

[57] ABSTRACT

A differential amplifier amplifies an FM signal supplied from an FM signal source. A phase shift circuit shifts a phase of a carrier signal included in an FM signal output from the differential amplifier. A multiplier circuit multiplies an FM signal supplied from the differential amplifier to a first balance input terminal and an FM signal supplied from the phase shift circuit to a second balance input terminal and then outputs a demodulation signal. A resistor serving as a supply means supplies an FM signal, whose carrier signal has a phase opposite to that of a carrier signal of an FM signal supplied from the differential amplifier to an output terminal of the phase shift circuit. The phase characteristics of the phase shift circuit is equivalently controlled and the phase of the FM signal supplied to the multiplier circuit controlled, thereby preventing a demodulation output from being distorted.

8 Claims, 8 Drawing Sheets

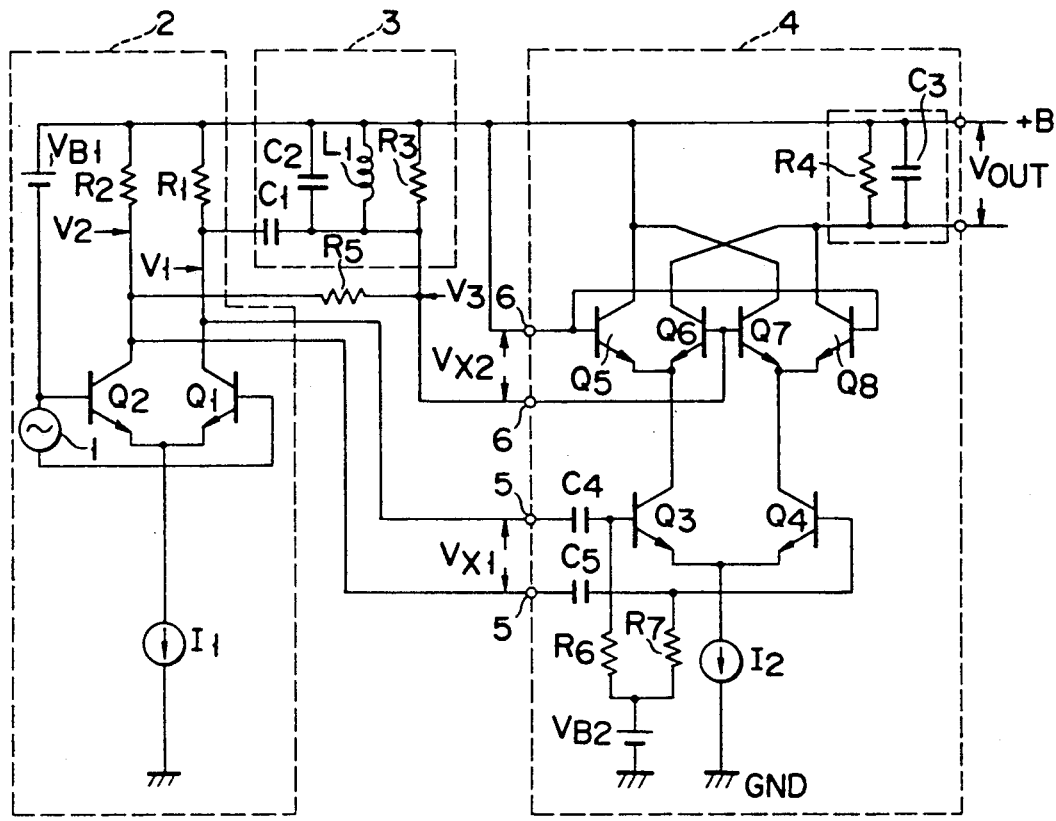
F I G. 1
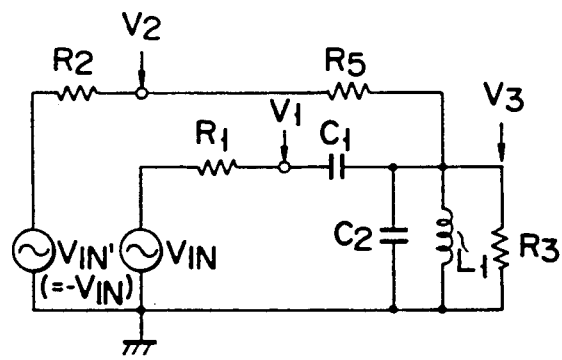
F I G. 2

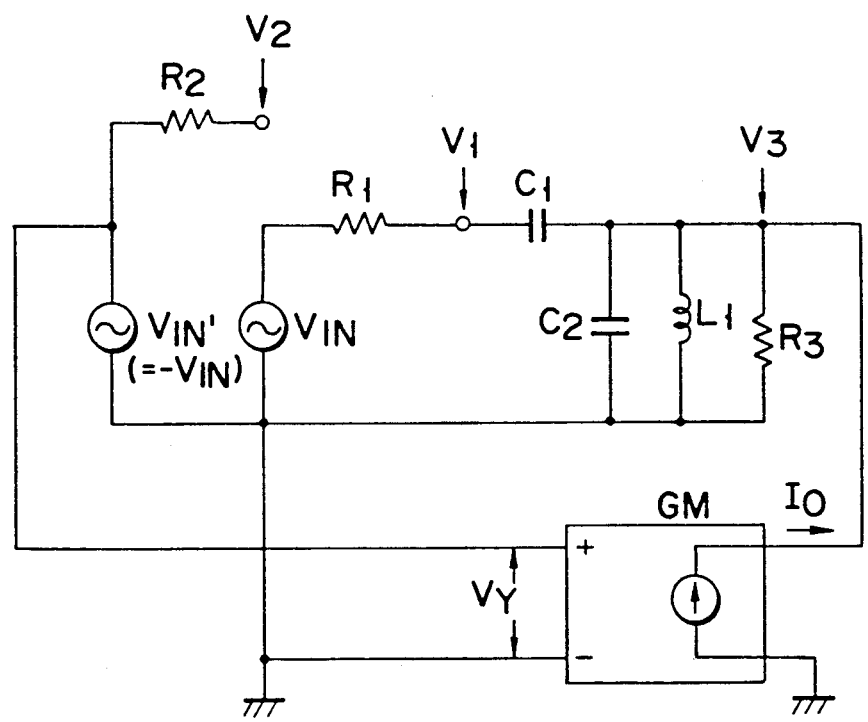
F I G. 5

FM DEMODULATOR CIRCUIT WHOSE DEMODULATION OUTPUT IS DECREASED IN DISTORTION

BACKGROUND OF THE INVENTION

1. Field of the Invention

The present invention relates to an FM demodulator circuit for use in an FM receiver or the like and, more particularly, to a quadrature FM demodulator circuit.

2. Description of the Related Art

FIG. 8 is a circuit diagram showing a conventional quadrature FM demodulator circuit suitable for an integrated circuit.

In FIG. 8, $V_{IN}$ represents a signal voltage of an FM input signal source 1. A differential amplifier 2 amplifies an FM signal supplied from the FM input signal source 1. A phase shift circuit 3 shifts a phase of a carrier signal as a center frequency of an FM signal supplied from the differential amplifier 2 by 90°. A double balance type differential multiplier circuit 4 multiplies a signal output from the phase shift circuit 3 and a signal output from the differential amplifier 2. The multiplier circuit 4 thus outputs a demodulation output voltage $V_{out}$.

In the differential amplifier 2, the bases of NPN transistors $Q_1$ and $Q_2$ constituting a differential pair are connected to both ends of the FM input signal source 1, and the emitters of the NPN transistors are connected to each other and grounded through a bias current source $I_1$. Resistive elements $R_1$ and $R_2$ are connected between the NPN transistors $Q_1$ and $Q_2$ and a power source +B, respectively. The power source +B is at an alternating-current-like reference potential. A bias voltage source $V_{B1}$ is connected between the base of the NPN transistor $Q_2$ and the power source +B.

In the phase shift circuit 3, one end of a capacitive element $C_1$ is connected to the collector of the NPN transistor $Q_1$, and a capacitive element $C_2$, an inductive element $L_1$, and a resistive element $R_3$ are connected in parallel between the other end of the capacitive element $C_1$ and the power source +B.

In the multiplier circuit 4, first balance input terminals 5 are connected to the collectors of the NPN transistors $Q_1$ and $Q_2$ which serve as output terminals of the differential amplifier 2, and second balance input terminals 6 are connected to the power source +B and the other end of the capacitive element $C_1$ which serves as an output terminal of the phase shift circuit 3. The first balance input terminals 5 are connected to one end of each of capacitive elements $C_4$ and $C_5$ for interrupting direct current. The other ends of the capacitive elements $C_4$ and $C_5$ are connected to one end of each of resistive elements $R_6$ and $R_7$, respectively. The other ends of the resistive elements $R_6$ and $R_7$ are grounded through a bias voltage source $V_{B2}$.

The other ends of the capacitive elements $C_4$ and $C_5$ are respectively connected to the bases of NPN transistors $Q_3$ and $Q_4$ constituting a differential pair. The emitters of the NPN transistors $Q_3$ and $Q_4$ are grounded through a bias current source $I_2$. The collector of the NPN transistor $Q_3$ is connected to the emitters of NPN transistors $Q_5$ and $Q_6$ constituting a differential pair, and the collector of the NPN transistor $Q_4$ is connected to the emitters of NPN transistors $Q_7$ and $Q_8$ constituting a differential pair. The bases of NPN transistors $Q_5$ and $Q_8$ are connected to the one of the second balance input terminals 6 and those of NPN transistors $Q_6$ and $Q_7$ are connected to the other second balance input terminal 6. The collectors of NPN transistors $Q_5$ and $Q_7$ are connected to the power source +B, and those of NPN transistors $Q_6$ and $Q_8$ are connected to the power source +B through a low pass filter 7. The low pass filter 7 includes a resistive element $R_4$ and a capacitive element $C_3$.

In FIG. 8, the circuits other than the phase shift circuit 3 constitute an integrated circuit, and the phase shift circuit 3 is externally connected to the integrated circuit.

If output voltages of the differential amplifier 2 are represented by $V_1$ and $V_2$, an output voltage of the phase shift circuit 3 is represented by $V_3$, a signal voltage $V_{x1}$ of the first balance input terminals 5 of the multiplier circuit 4 and a signal voltage $V_{x2}$ of the second balance input terminals 6 thereof are given by the following equations, respectively.

$$V_{x1} = V_1 - V_2$$

$$V_{x2} = V_3$$

The multiplier circuit 4 thus multiplies an FM signal supplied from the differential amplifier 2 to the first balance input terminals 5 by an FM signal supplied from the phase shift circuit 3 to the second balance input terminals 6. The low pass filter eliminates a carrier component and a harmonic component included in an output signal of the multiplication and then outputs a demodulation signal.

FIG. 9 shows an equivalent circuit for analyzing the phase characteristics of the circuit shown in FIG. 8 from which an influence of each of the transistors is removed, and FIG. 10 shows a phase difference Φ between the signal voltage $V_{x1}$ and signal voltage $V_{x2}$ with respect to a carrier frequency fin of the equivalent circuit shown in FIG. 9.

In FIG. 9, $V_{IN}$ indicates an anti-phase voltage of the signal voltage $V_{IN}$ of the FM input signal source 1, and the capacitive elements $C_1$ and $C_2$ of the phase shift circuit 3 have capacitances of 6.8 pF and 80 pF, respectively, the inductive element $L_1$ has an inductance of 2.77 μH, and the resistive element $R_3$ has a resistance of 6.8 kΩ.

The characteristic shown in the upper portion of FIG. 10 is the phase difference Φ and is represented using the resistances of the resistive elements $R_1$ and $R_2$ of the differential amplifier 2 as parameter. The characteristics shown in the lower portion of FIG. 10 is the linearity of the phase difference Φ obtained by differentiating the phase difference Φ by the carrier frequency fin.

What is noted in the characteristics shown in FIG. 10 is that an inflection point of the linearity of the phase difference Φ is shifted from a phase difference Φ of 90° as the resistances of the resistive elements $R_1$ and $R_2$ of the differential amplifier 2 increases. The constants of the phase shift circuit 3 are set so that the phase difference Φ is 90° when the carrier frequency fin is the central frequency of the FM signal. For this reason, if the resistances of the resistive elements $R_1$ and $R_2$ of the differential amplifier 2 increase, the waveform of a demodulation output is asymmetric in coordinates and the demodulation output increases in distortion.

It is therefore necessary for the conventional quadrature FM demodulator circuit shown in FIG. 8 that the resistances of the resistive elements $R_1$ and $R_2$ are made as small as possible in order to reduce the distortion of the demodulation output. Since, however, the current value of the bias current source $I_1$ needs to be remarkably increased to keep the amplitudes of output voltages $V_1$ and $V_2$ of the differential amplifier 2 at predetermined values, a power loss greatly increases and accordingly the conventional quadrature FM demodulator circuit is unsuitable for a power save type FM demodulator circuit.

SUMMARY OF THE INVENTION

It is accordingly an object of the present invention to provide a power save type FM demodulator circuit with a simple configuration suitable for an integrated circuit, in which a distortion of demodulation output can be minimized without increasing current consumption.

The above object is attained by an FM demodulator circuit having the following configuration.

The FM demodulator comprises:

a differential amplifier for amplifying an FM signal supplied from an FM signal source;

a phase shift circuit for shifting a phase of a carrier signal included in an FM signal output from the differential amplifier;

a multiplier circuit having first and second balance input terminals, for multiplying an FM signal supplied from the differential amplifier to the first balance input terminal and an FM signal supplied from the phase shift circuit to the second balance input terminal and outputting a demodulation signal; and supply means for supplying, to an output terminal of the phase shift circuit, an FM signal whose carrier signal having a phase opposite to that of a carrier signal of an FM signal supplied from the differential amplifier to the phase shift circuit.

According to the present invention, the FM signal whose carrier signal having a phase opposite to that of the carrier signal of the FM signal output from the differential amplifier and supplied to the phase shift circuit, is supplied to the output terminal of the phase shift circuit by the supply means. Therefore, the phase characteristics of the phase shift circuit are equivalently controlled, and the phase of the FM signal supplied to the multiplier circuit is controlled. The resistance of a resistive element serving as the supply means or the conversion conductance of current supply means is properly selected, so that an inflection point of linearity of phase difference of the signal supplied to the multiplier circuit can be set at 90° and a distortion of demodulation output can be prevented. Even when the current of a bias current source of the differential amplifier is set to a low value to suppress current consumption and the resistance of a resistive element of the differential amplifier is set high so that the amplitude of a signal voltage of the differential amplifier is kept at a predetermined value, the inflection point can be set at 90° in the central frequency of the FM signal and the distortion of demodulation output can be prevented.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing an FM demodulator circuit according to a first embodiment of the present invention;

FIG. 2 is an equivalent circuit diagram of the FM demodulator circuit shown in FIG. 1;

FIG. 5 is an equivalent circuit diagram of the FM demodulator circuit shown in FIG. 4;

DETAILED DESCRIPTION OF THE PREFERRED EMBODIMENTS

Figure 3:
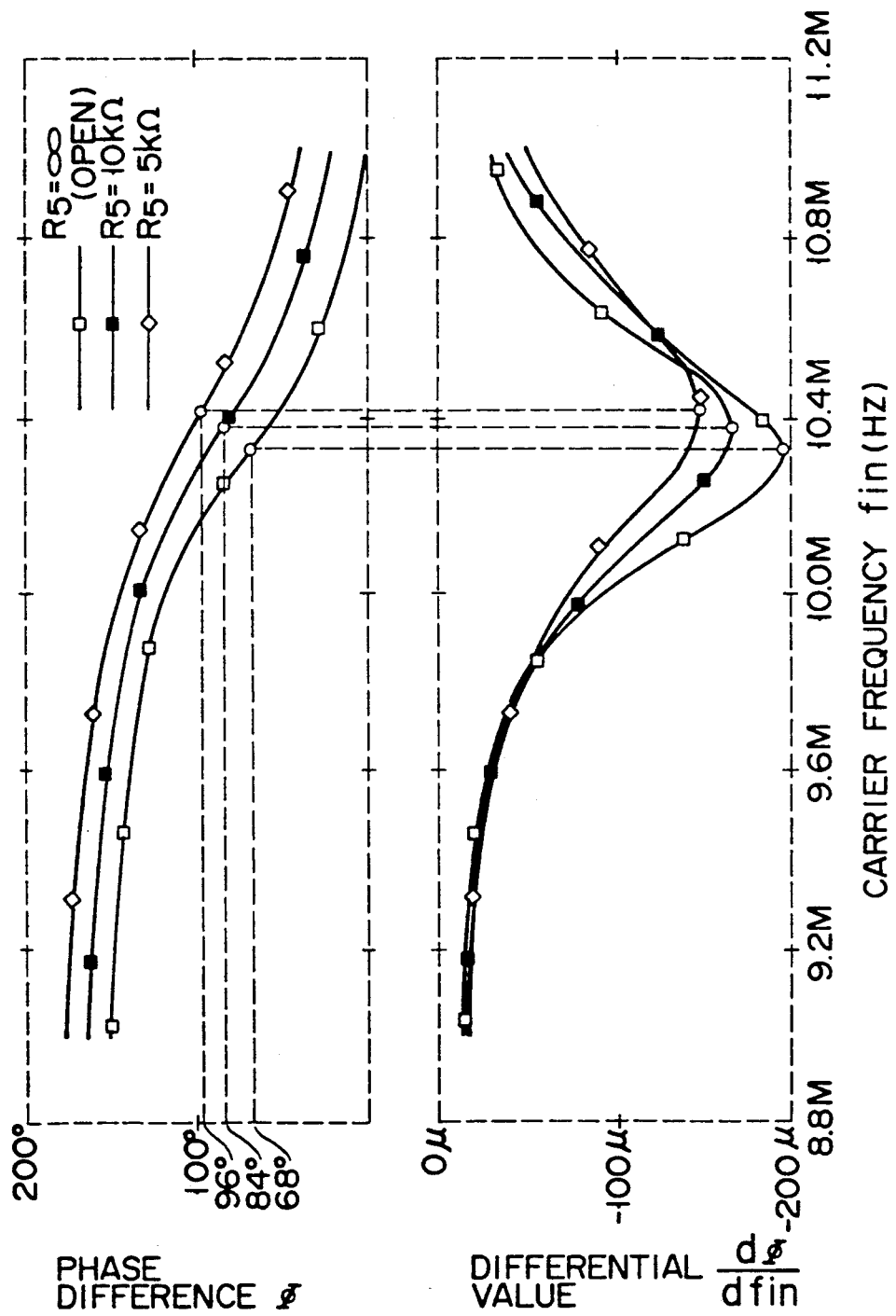
FIG. 3 is a graph showing the phase characteristics of the FM demodulator circuit shown in FIG. 1.

Embodiments of the present invention will be described with reference to the accompanying drawings.

FIG. 1 is a circuit diagram showing an FM demodulator circuit according to the first embodiment of the present invention. In FIG. 1, the same components as those in FIG. 8 are denoted by the same reference numerals and their descriptions are omitted.

In the circuit shown in FIG. 1, a resistive element $R_5$ is connected between an output terminal of a differential amplifier 2 and that of a phase shift circuit 3. The resistive element $R_5$ is included in an integrated circuit to supply, to the output terminal of the phase shift circuit 3, an FM signal whose carrier signal having a phase opposite to that of a carrier signal of an FM signal supplied from the differential amplifier 2 to the phase shift circuit 3 and having an amplitude proportionate to that of the carrier signal. More specifically, the resistive element $R_5$ is connected between the collector of a transistor $Q_2$ and other end of a capacitor $C_1$.

In the FIG. 1 circuit, the FM signal whose carrier signal having a phase opposite to that of the carrier signal included in the FM signal supplied to the phase shift circuit 3, is fed to the output terminal of the phase shift circuit 3 For this reason, the phase characteristics of the phase shift circuit 3 are equivalently controlled, and the phase of an FM signal supplied to second balance input terminals 6 of a multiplier circuit 4 is controlled.

Figure 8:
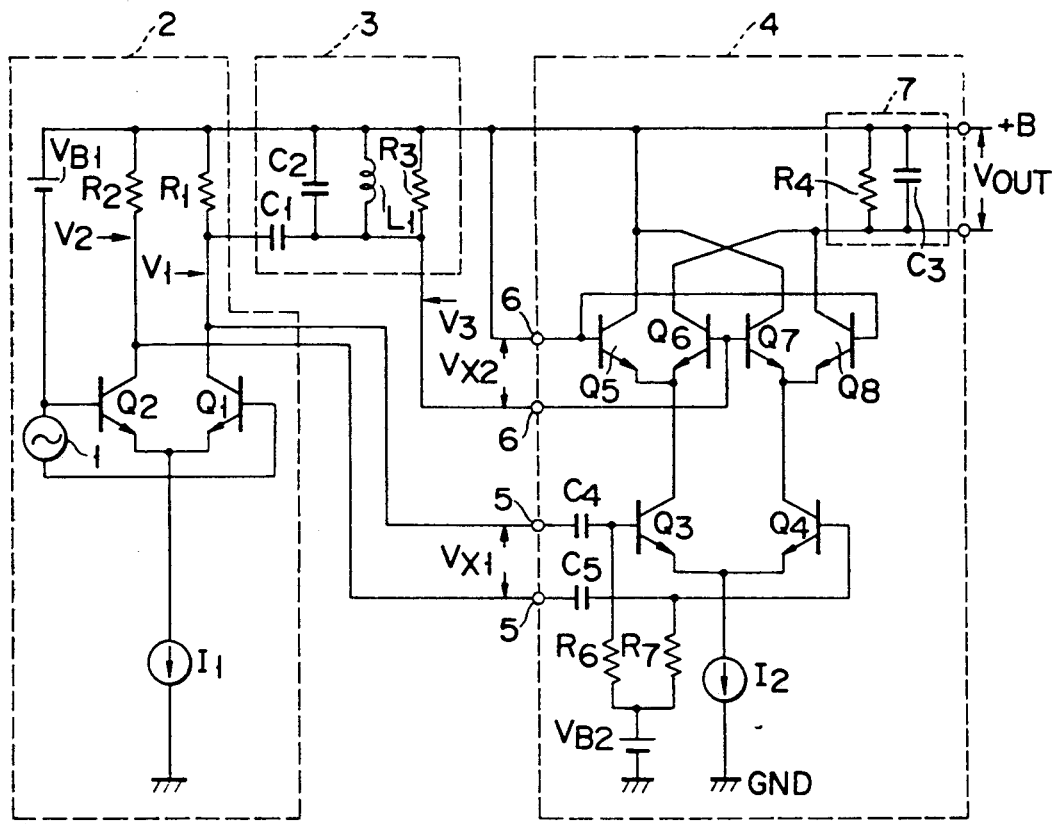
FIG. 8 is a circuit diagram showing a conventional FM demodulator circuit.

FIG. 2 is an equivalent circuit diagram for analyzing the phase characteristics of the circuit shown in FIG. 8 from which an influence of each of the transistors is removed, and FIG. 3 is a graph showing the relationship in phase difference $\Phi$ between signal voltage $V_{x1}$ and signal voltage $V_{x2}$ with respect to a carrier frequency fin of the circuit shown in FIG. 1.

Resistive element $R_1 = R_2 = 2$ k$\Omega$ in the circuit shown in FIG. 2, and the constants other than the resistance of the resistive element $R_5$ have been described in FIG. 8.

FIG. 3 shows a phase difference $\Phi$ between signal voltages $V_{x1}$ and $V_{x2}$ with respect to the carrier frequency fin, and the values of the resistive element $R_5$ ($R_5 = \infty$, 10 k$\Omega$, 5 k$\Omega$) are used as parameter. The characteristic shown in the lower part of FIG. 3 is obtained by differentiating the phase difference $\Phi$ by the carrier frequency fin, that is, the characteristic is linearity of the phase difference $\Phi$.

As is apparent from FIG. 3, the phase difference $\Phi$ corresponding to an inflection point of the linearity of the phase difference $\Phi$ varies so that it is 68° when $R_5 = \infty$, it is 84° when $R_5 = 10$ k$\Omega$, and it is 96°, when $R_5 = 5$ k$\Omega$. It is understood that, if $R_5$ decreases from $\infty$, which corresponds to the value of the conventional resistive element, the inflection point approaches 90°, and then exceeds 90°. In other words, the phase difference $\Phi$ corresponding to the inflection can be adjusted to 90°, by the central frequency of an FM signal if the value of resistive element $R_5$ is properly selected. If the inflection point coincides with 90°, the waveform of a demodulation output is symmetrical in coordinates and the distortion thereof is minimized.

Even when the amount of current of a bias current source $I_1$ is set small to decrease current consumption and the resistive elements $R_1$ and $R_2$ of the differential amplifier 2 are set to have a high value of, e.g., 2 k$\Omega$ so that the amplitudes of output voltages $V_1$ and $V_2$ of the differential amplifier 2 can be kept at a predetermined value, the inflection point of the linearity of the phase difference $\Phi$ can be set to 90°. Therefore the distortion of demodulation output will be almost eliminated.

Figure 4:
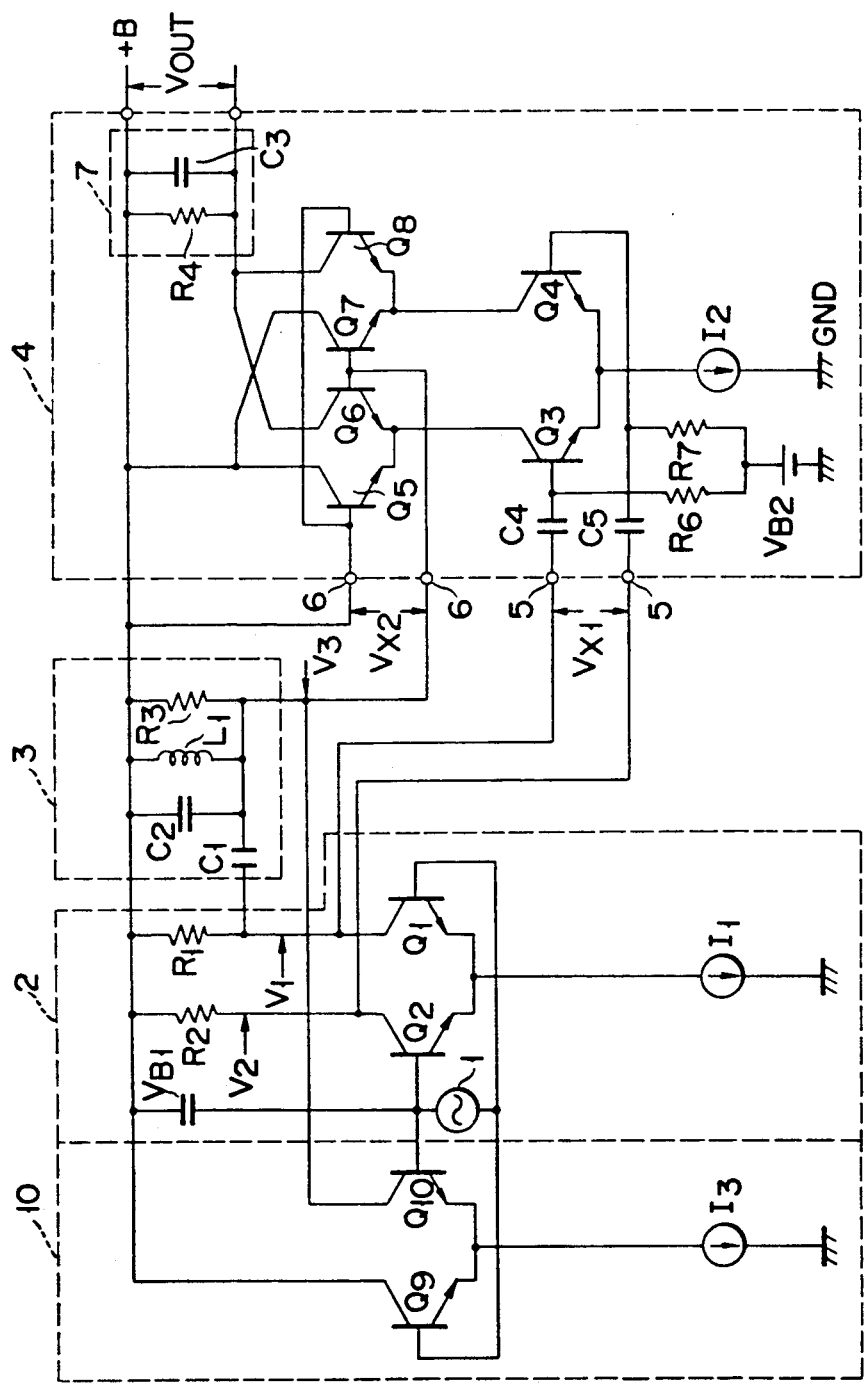
FIG. 4 is a circuit diagram showing an FM demodulator circuit according to a second embodiment of the present invention.

FIG. 4 is a circuit diagram showing a quadrature FM demodulator circuit according to the second embodiment of the present invention. In FIG. 4, the same components as those in FIG. 8 are denoted by the same reference numerals and their descriptions are omitted.

A current supply means is added to the circuit shown in FIG. 4. The current supply means supplies, to an output terminal of a phase shift circuit 3, an FM signal whose carrier signal having a phase opposite to that of a carrier signal of an FM signal supplied from the differential amplifier (hereinafter referred to as a first differential amplifier) to the phase shift circuit 3 and having an amplitude proportionate to that of the carrier signal. The current supply means comprises, for example, a second differential amplifier 10 for amplifying an FM signal supplied from an FM input signal source 1.

In the second differential amplifier 10, the emitters of NPN transistors $Q_9$ and $Q_{10}$ are grounded through a bias current source $I_3$. The base of the transistor $Q_{10}$ is connected to a negative electrode of a bias voltage source $V_{B1}$ and one end of the FM input signal source 1, and the base of the transistor $Q_9$ is connected to the other end of the FM input signal source 1. The collector of the transistor $Q_9$ is connected to a power source $+B$, and the collector of the transistor $Q_{10}$ is connected to the output terminal of the phase shift circuit 3, namely, to the other end of a capacitor $C_1$. The second differential amplifier 10 is usually included in an integrated circuit.

In the FIG. 4 circuit, an FM signal whose carrier signal having a phase opposite to that of a carrier signal of an FM signal supplied to the phase shift circuit 3, is supplied to the output terminal of the phase shift circuit. For this reason, the phase characteristics of the phase shift circuit 3 are equivalently controlled, and the phase of an FM signal supplied to the second balance input terminals 6 of a multiplier circuit 4 is controlled.

Figure 6:
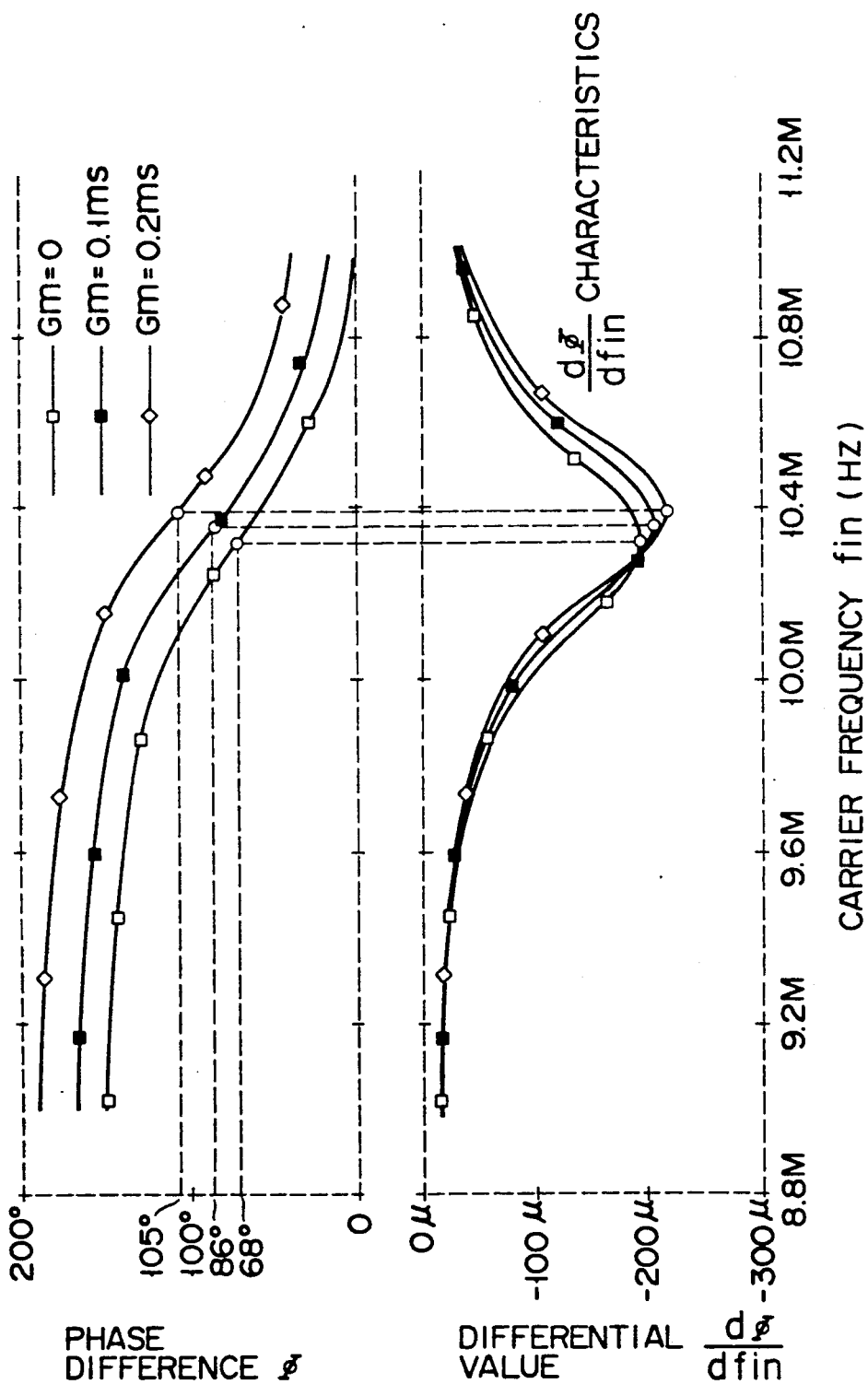
FIG. 6 is a graph showing the phase characteristics of the FM demodulator circuit shown in FIG. 4.

FIG. 5 is an equivalent circuit diagram for analyzing the phase characteristics of the circuit shown in FIG. 4 from which the influence of each of the transistors is removed, and FIG. 6 is a graph showing the relationship in phase difference $\Phi$ between signal voltages $V_{x1}$ and $V_{x2}$ with respect to the carrier frequency fin of the circuit shown in FIG. 4.

In FIG. 5, GM indicates a conductance circuit for converting an input voltage $V_Y$ into a current signal. Assuming that the conversion conductance of the conductance circuit is Gm, output current $I_0$ is expressed as follows.

$$I_0 = Gm \times V_Y$$

Figure 9:
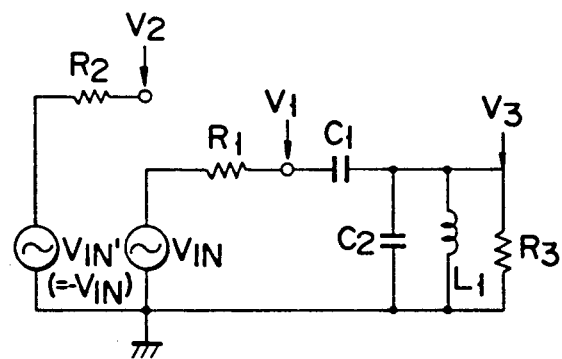
FIG. 9 is an equivalent circuit diagram of the conventional FM demodulator circuit shown in FIG. 8.
Figure 10:
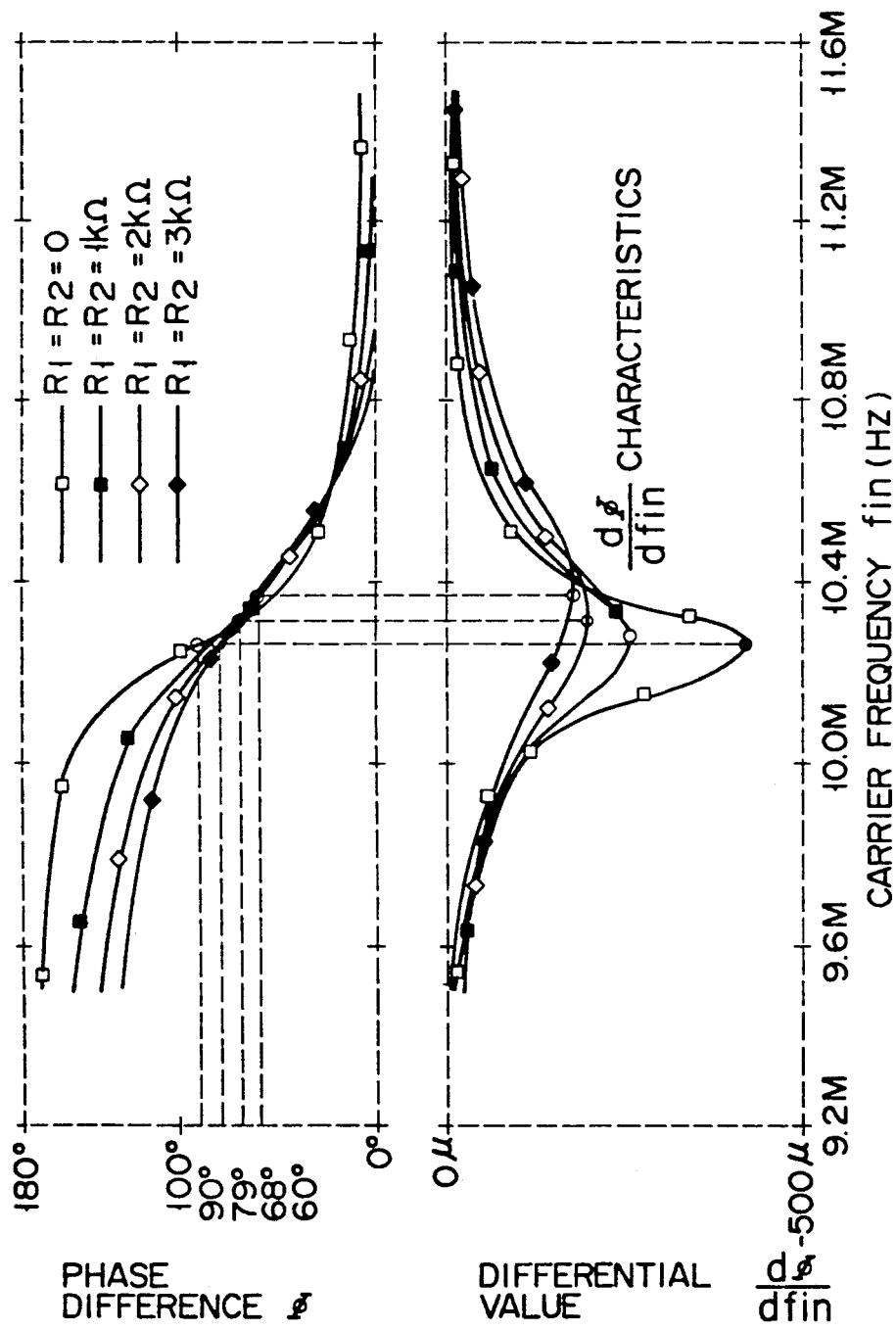
FIG. 10 is a graph showing the phase characteristics of the conventional FM demodulator circuit shown in FIG. 8.

Resistive element $R_1 = R_2 = 2$ k$\Omega$, and the constants other than the resistances of $R_5$ and $R_2$ have been described in FIG. 9.

FIG. 6 shows a phase difference $\Phi$ between signal voltages $V_{x1}$ and $V_{x2}$ with respect to the carrier frequency fin and, more specifically, phase differences $\Phi$ when the conversion conductance Gm is 0 (corresponding to the prior art), Gm is 0.1 mS (siemens), and Gm is 0.2 mS. The characteristic shown in the lower part of FIG. 6 is obtained by differentiating the phase difference $\Phi$ by the carrier frequency fin. The characteristic curve shows the linearity of the phase difference $\Phi$.

As is apparent from FIG. 6, the phase difference $\Phi$ corresponding to an inflection point of the linearity of the phase difference $\Phi$ varies so that it is 68°, when Gm = 0, it is 86°, when Gm = 0.1 mS, and it is 105°, when Gm = 0.2 mS. It is understood that, if the conversion conductance Gm increases from 0, the inflection point approaches 90°, and then exceeds 90°. In other words, the inflection can be adjusted to 90°, by the central frequency of an FM signal if the value of the bias current source $I_3$ is so selected that Gm has a proper value. The distortion of a demodulation output can thus be minimized.

Even when the amount of current of the bias current source $I_1$ of the first differential amplifier 2 is set small to decrease current consumption and the resistive elements $R_1$ and $R_2$ of the first differential amplifier 2 are set to have a high value (for example, $R_1 = R_2 = 2$ k$\Omega$) so that the amplitudes of output voltages $V_1$ and $V_2$ of the differential amplifier 2 can be kept at a predetermined value, the inflection point of the linearity of the phase difference $\Phi$ can be set to 90°, and therefore the distortion of demodulation output can be almost eliminated.

Figure 7:
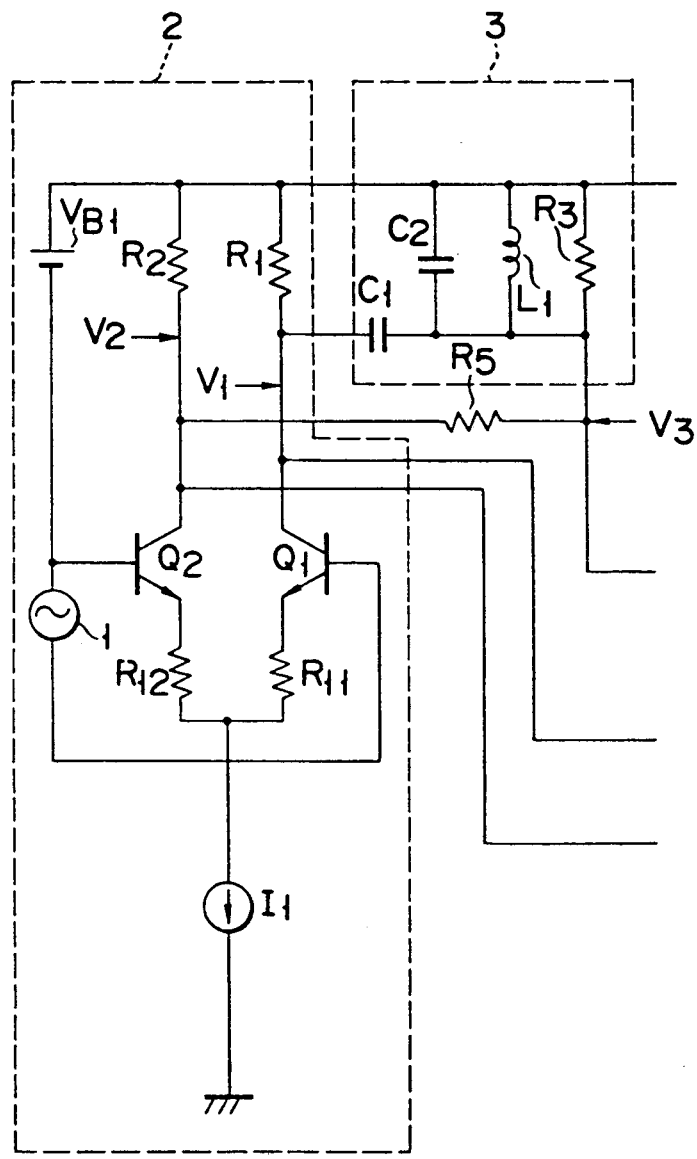
FIG. 7 is a circuit diagram showing the main part of an FM demodulator circuit according to a third embodiment of the present invention.

As shown in FIG. 7, resistive elements $R_{11}$ and $R_{12}$ can be connected to the emitters of transistors $Q_1$ and $Q_2$ constituting the differential amplifier 1 to adjust the gain to a desired value. Furthermore, resistive elements can be connected to the emitters of transistors constituting another differential amplifier.

The present invention is not limited to the respective constants of the above embodiments or carrier frequency fin shown in the drawings.

Various changes and modifications to the present invention can be made without departing from the subject matter of the present invention.

What is claimed is:

1. An FM demodulator circuit comprising:
   a differential amplifier for amplifying an FM signal supplied from an FM signal source;
   a phase shift circuit for shifting a phase of a carrier signal included in an FM signal output from said differential amplifier;
   a multiplier circuit having first and second balance input terminals, for multiplying an FM signal supplied from said differential amplifier to the first balance input terminal and an FM signal supplied from said phase shift circuit to the second balance input terminal and outputting a demodulation signal; and supply means for supplying, to an output terminal of said phase shift circuit, an FM signal whose carrier signal has a phase opposite to that of a carrier signal of an FM signal supplied from said differential amplifier to said phase shift circuit.

2. An FM modulator circuit according to claim 1, wherein said supply means includes a resistor.

3. An FM modulator circuit according to claim 1, wherein said differential amplifier includes transistors whose emitters are connected to resistive elements.

4. An FM modulator circuit comprising:
- a differential amplifier for amplifying an FM signal supplied from an FM signal source, said differential amplifier including first and second transistors whose bases are connected to said FM signal source;
- a phase shift circuit for shifting a phase of a carrier signal included in an FM signal output from a collector of said first transistor;
- a multiplier circuit having first and second balance input terminals, for multiplying an FM signal supplied from collectors of said first and second transistors to the first balance input terminal and an FM signal supplied from said phase shift circuit to the second balance input terminal and outputting a demodulation signal; and
- a resistor for supplying, to an output terminal of said phase shift circuit, an FM signal output from the collector of said second transistor, said FM signal including a carrier signal whose phase is opposite to that of a carrier signal of an FM signal output from the collector of said first transistor.

5. An FM modulator circuit comprising:
- a differential amplifier for amplifying an FM signal supplied from an FM signal source;
- a phase shift circuit for shifting a phase of a carrier signal included in an FM signal output from said differential amplifier;
- a multiplier circuit having first and second balance input terminals, for multiplying an FM signal supplied from said differential amplifier to the first balance input terminal and an FM signal supplied from said phase shift circuit to the second balance input terminal and outputting a demodulation signal; and
- current supply means for supplying, to an output terminal of said phase shift circuit, an FM signal current whose carrier signal has a phase opposite to that of a carrier signal of an FM signal supplied from said differential amplifier to said phase shift circuit and having an amplitude proportionate to that of said carrier signal.

6. An FM demodulator circuit according to claim 5, wherein said current supply means includes the differential amplifier for amplifying the FM signal supplied from said FM signal source.

7. An FM demodulator circuit according to claim 5, wherein said differential amplifier includes transistors whose emitters are connected to resistive elements.

8. An FM demodulator circuit comprising:
- a first differential amplifier for amplifying an FM signal supplied from an FM signal source, said first differential amplifier including first and second transistors constituting a differential pair, and bases of said first and second transistors being connected to said FM signal source;
- a phase shift circuit for shifting a phase of a carrier signal included in an FM signal output from a collector of said first transistor;
- a multiplier circuit having first and second balance input terminals, for multiplying an FM signal supplied from collectors of said first and second transistors to the first balance input terminal and an FM signal supplied from said phase shift circuit to the second balance input terminal and outputting a demodulation signal; and
- a second differential amplifier for amplifying the FM signal supplied from said FM signal source, said second differential amplifier including third and fourth transistors constituting a differential pair, bases of said third and fourth transistors being connected to said FM signal source, a collector of said fourth transistor being connected to an output terminal of said phase shift circuit, and an FM signal output from the collector of said fourth transistor including a carrier signal whose phase is opposite to that of a carrier signal of an FM signal output from the collector of said first transistor.

* * * * *